(12) United States Patent
Pinkerton et al.

(10) Patent No.: US 8,193,812 B2
(45) Date of Patent: Jun. 5, 2012

(54) TRANSCEIVE SURFACE COIL ARRAY FOR MAGNETIC RESONANCE IMAGING AND SPECTROSCOPY

(75) Inventors: Robert G. Pinkerton, Harrowsmith (CA); Ravi S. Menon, London (CA)

(73) Assignee: Robarts Research Institute, London, Ontario (CA)

( * ) Notice: Subject to any disclaimer, the term of this patent is extended or adjusted under 35 U.S.C. 154(b) by 0 days.

(21) Appl. No.: 12/827,054

(22) Filed: Jun. 30, 2010

(65) Prior Publication Data

US 2011/0163751 A1 Jul. 7, 2011

Related U.S. Application Data

(63) Continuation of application No. 12/325,714, filed on Dec. 1, 2008, now abandoned, which is a continuation of application No. 11/085,800, filed on Mar. 21, 2005, now abandoned.

(60) Provisional application No. 60/554,350, filed on Mar. 19, 2004.

(51) Int. Cl.
*G01V 3/00* (2006.01)

(52) U.S. Cl. ........................................ 324/318; 324/322

(58) Field of Classification Search .................. 324/318, 324/322, 300, 309, 307
See application file for complete search history.

(56) References Cited

U.S. PATENT DOCUMENTS

| 5,208,534 | A  | * | 5/1993  | Okamoto et al. | 324/309 |
| 6,323,648 | B1 | * | 11/2001 | Belt et al.    | 324/322 |
| 7,091,721 | B2 | * | 8/2006  | Jevtic         | 324/318 |
| 7,151,373 | B2 | * | 12/2006 | Reykowski      | 324/318 |
| 7,248,051 | B2 | * | 7/2007  | Wang et al.    | 324/322 |

* cited by examiner

*Primary Examiner* — Louis Arana
(74) *Attorney, Agent, or Firm* — Faegre Baker Daniels LLP

(57) ABSTRACT

A surface coil array comprises a surface coil support and an arrangement of non-overlapping magnetically decoupled surface coils mounted on the support. The surface coils encompass a volume into which a target to be imaged is placed. Magnetic decoupling circuits act between adjacent surface coils. Impedance matching circuitry couples the surface coils to conventional transmit and receive components.

43 Claims, 6 Drawing Sheets ns
TRANSCEIVE SURFACE COIL ARRAY FOR MAGNETIC RESONANCE IMAGING AND SPECTROSCOPY

CROSS-REFERENCE TO RELATED APPLICATIONS

This application is a continuation of application Ser. No. 12/325,714, filed Dec. 1, 2008, entitled "Transceive Surface Coil Array for Magnetic Resonance Imaging and Spectroscopy", abandoned, which is a continuation of application Ser. No. 11/085,800, filed Mar. 21, 2005, entitled "Transceive Surface Coil Array for Magnetic Resonance Imaging and Spectroscopy", abandoned, which claims the benefit of U.S. Provisional Patent Application No. 60/554,350 filed on Mar. 19, 2004 for an invention entitled "Transceive Surface Coil Array For Magnetic Resonance Imaging and Spectroscopy".

FIELD OF THE INVENTION

The present invention relates generally to magnetic resonance imaging (MRI) and more specifically, to a transceive surface coil array for magnetic resonance imaging and spectroscopy.

BACKGROUND OF THE INVENTION

Nuclear Magnetic Resonance (NMR) Imaging, or Magnetic Resonance Imaging (MRI) as it is commonly known, is a non-invasive imaging modality that can produce high resolution, high contrast images of the interior of the human body. MRI involves the interrogation of the nuclear magnetic moments of a subject placed in a strong magnetic field with radio frequency (RF) magnetic fields. A MRI system typically comprises a fixed magnet to create the main strong magnetic field, a gradient coil assembly to permit spatial encoding of signal information, a variety of RF resonators or RF coils as they are commonly known, to transmit RF energy to, and receive signals emanating back from, the subject being imaged, and a computer to control overall MRI system operation and create images from the signal information obtained.

The design of RF resonators operating in the near-field regime plays a major role in the quality of magnetic resonance imaging. Over the past few decades, the designs of RF resonators have significantly evolved from the simple solenoid coils of wire that were typically used. The volume coil, such as for example the saddle coil, hybrid birdcage or TEM, has been a popular choice of MRI transmitter and/or receiver for large fields of view (FOV) due to the ability to match it to 50Ω impedance transmit and receive components and its homogeneous sensitivity profile. Although these volume coils operate well at low magnetic field strengths, they become less effective in the high field regime i.e. at magnetic field strengths greater than 3 T. As the static magnetic field strength used in MRI increases, the wavelength of the associated Larmor RF approaches the dimensions of the volume coil and volume of interest (VOI). Several imaging problems arise in this full wavelength regime namely, increased radiation losses, increased local and global specific absorption rate (SAR), and dielectric resonance effects that create both inhomogeneous images and signal loss.

By using surface coils to receive, one can reduce the detrimental effects of dielectric resonance on signal homogeneity commonly observed with volume coils at higher field strengths (>3 T). Surface coils can also be designed to target specific VOIs thereby to reduce unnecessary power deposition within the patient. Furthermore, the increased sensitivity of surface coils for reception, in comparison to volume coils, presents an opportunity for increased image signal-to-noise ratio (SNR) in both receive-only and transmit and/or receive ("transceive") modes.

With the advent of fast parallel imaging techniques such as SMASH, SENSE and transmit SENSE, there exists a greater need for flexible placement and combination of multiple receiver and/or transmitter RF coils. The sensitivity profiles of these multiple RF coils are required for and influence the efficiency of these fast parallel imaging methods. Fast parallel imaging techniques provide the ability to remove or unfold aliasing artefacts in under-sampled images. This ability to un-alias images provides a means to increase temporal resolution. Images that may have been impossible to acquire within the time constraints of breath hold techniques may be realizable through the reduction of motion artifacts.

There are several design approaches for both volume and surface coils that have been implemented to acquire multiple sensitivity profiles with considerable success. For example, the degenerate mode birdcage has been shown to be useful in sensitivity encoding although receive-only surface coil arrays provide higher SNR and are more suitable for high field MRI. The predominant impediment to surface coil array design is however, the strong magnetic coil-to-coil coupling.

There are several design approaches available to reduce this magnetic coil-to-coil coupling, including preamplifier decoupling, strip transmission line arrays, overlap geometries, and capacitive decoupling networks Magnetic coil-to-coil coupling can be substantially eliminated between two (2) neighboring surface coils using a unique overlap of surface coils. Unfortunately, the resultant overlapping sensitivity profiles are less than ideal for fast parallel imaging techniques, which are more effective when sensitivity profiles of individual surface coils do not overlap.

Alternatively, the effect of magnetic coil-to-coil coupling on both nearest neighbor and next nearest neighbor surface coils can be reduced using a decoupling method employing low impedance preamplifiers. Unfortunately, low (or high) impedance preamplifiers are not generally available off-the-shelf and are therefore, more complex, expensive and time consuming to implement. Furthermore, low input impedance RF power amplifiers are not widely commercially available off-the-shelf, thereby practically limiting this coil-to-coil magnetic coupling reduction technique to receive-only applications. More complicated capacitive ladder networks have been employed to reduce magnetic coil-to-coil coupling at lower field strengths. However, considerable electric field loss and strong coupling between lattice networks limits their application at higher field strengths.

Other coil-to-coil coupling reduction techniques have also been considered. For example, U.S. Pat. No. 5,973,495 to Mansfield discloses a method and apparatus for eliminating mutual inductance effects in resonant coil assemblies in which a plurality of coils is situated in sufficiently close proximity to create small mutual inductances between the coils. Mutual inductances are evaluated using a T star or other transformation of the relevant parts of the circuit thereby to isolate the inductances in such a way that series capacitances may be introduced to tune out the mutual inductances at a common frequency, reducing the coil array to a synchronously tuned circuit. Unfortunately, this design requires a common ground resulting in electric field losses and requires a common connection between all of the coils, which is geometrically restrictive.

U.S. Pat. No. 6,788,059 to Lee et al. discloses an RF detector array based on a microstrip array decoupling scheme. The detector array comprises a plurality of conductive array elements that is substantially parallel to a conductive ground plane and a plurality of capacitors. At least one capacitor is shunted from each conductive array element to the ground plane to adjust a corresponding electrical length of each conductive array element. A combination of each respective conductive array element, at least one corresponding capacitor and the ground plane forms a resonator that resonates at a selected frequency. A decoupling interface and a plurality of matching boxes match each decoupled strip to a selected impedance.

U.S. Patent Application Publication No. 2002/0169374 to Jevtic discloses a capacitive ladder network to achieve next nearest neighbor (NNN) coil-to-coil decoupling. Unfortunately, this ladder network is complex and appears to be limited to low field MRI applications, as considerable electric field losses, and strong coupling between lattice networks would limit its application at high field strengths.

U.S. Patent Application Publication No. 2003/0184293 to Boskamp et al. discloses a multiple channel array coil for magnetic resonance imaging, that similar to Lee et al., is based on a microstrip array decoupling scheme. The array coil includes a plurality of conductive strips formed within a dielectric medium. The conductive strips are arranged into a generally cylindrical configuration with each of the strips having a length selected to cause each of the conductive strips to serve as a resonator at a frequency corresponding to a proton MRI frequency. The cylindrical configuration of the conductive strips forms a multiple channel, volume resonator in which each of the conductive strips is isolated from the remaining strips.

As will be appreciated, there exists a need for a surface coil array that is capable of transmit and/or receive operation for use in fast parallel imaging techniques such as SENSE imaging. There is a further need for a surface coil array that is capable of operation at both low and high magnetic field strengths without succumbing to SAR limitations. There is a further need for a surface coil array that can operate with conventional 50Ω transmit and receive components including preamplifiers and less expensive low power amplifiers, while maintaining the SNR benefits of receive-only surface coils.

It is therefore an object of the present invention to provide a novel surface coil array for magnetic resonance imaging and spectroscopy.

SUMMARY OF THE INVENTION

Accordingly, in one aspect there is provided a surface coil array comprising:
a plurality of spaced surface coils arranged about a volume; and
magnetic decoupling circuits acting between said surface coils.

In one embodiment, the magnetic decoupling circuits act between adjacent pairs of surface coils. The magnetic decoupling circuits are purely capacitive with each magnetic decoupling circuit including a single capacitor. The capacitive reactance of each magnetic decoupling circuit is equal to the mutual inductive reactance between adjacent surface coils.

The surface coils are generally evenly spaced about the volume and are mounted on a dielectric support. Dielectric loss reducing elements in the form of low-loss lumped capacitors are distributed about the surface coils.

Baluns are coupled to the surface coils and are impedance matched to feed network circuitry coupled thereto. The feed circuitry is 50Ω component-based. The baluns in one embodiment are configured to provide transmit signals generated by the feed network circuitry to the surface coils for transmit operation and to provide receive signals received by the surface coils to the feed network for receive operation. Alternatively, in another embodiment the baluns are configured to condition the surface coil array to a receive-only mode. In the receive-only mode, the baluns isolate the surface coils from the feed network circuitry when the feed network circuitry generates transmit signals.

According to another aspect there is provided a surface coil array comprising:
a surface coil support;
a plurality of generally evenly spaced surface coils mounted on said support and surrounding a volume into which a target to be imaged is placed; and
capacitive decoupling circuitry acting between said surface coils to reduce magnetic coil-to-coil coupling.

According to yet another aspect there is provided an RF resonator comprising:
a surface coil array including an arrangement of non-overlapping magnetically decoupled surface coils encompassing a volume; and
a feed network coupled to said surface coil array, said feed network at least receiving signals received by said surface coils during imaging of a target within said volume.

According to still yet another aspect there is provided a surface coil array comprising:
a surface coil support; and
an arrangement of non-overlapping magnetically decoupled surface coils mounted on said support and encompassing a volume into which a target to be imaged is placed.

The surface coil array is advantageous in that it provides the flexibility of using a single array for transmitting and/or receiving RF signals, which has benefits in fast parallel imaging techniques and limits image artefacts associated with using separate transmit and receive coil arrays. The surface coil array is also less SAR limited at high field strengths due to the proximity of the surface coil array to the imaging volume, thereby limiting electric field losses. Further, the surface coil array can be tuned for a variety of paramagnetic nuclei (e.g. $^{13}C$, $^{1}H$, $^{23}Na$, $^{31}P$, etc. . . . ) for use in many MR imaging and spectroscopy applications.

The surface coil array provides for the ability to vary surface coil size and geometry thereby offering great flexibility in custom imaging applications (e.g. whole body imaging (TIM)). As the surface coil array can be used with multiple, more economical lower power amplifiers for transmit applications, more control in imaging sequences is available. Also, the surface coil array provides for use with conventional 50Ω transmit and receive components while maintaining isolation between surface coils.

BRIEF DESCRIPTION OF THE DRAWINGS

Embodiments will now be described more fully with reference to the accompanying drawings in which.

DETAILED DESCRIPTION OF THE EMBODIMENT

Figure 1:
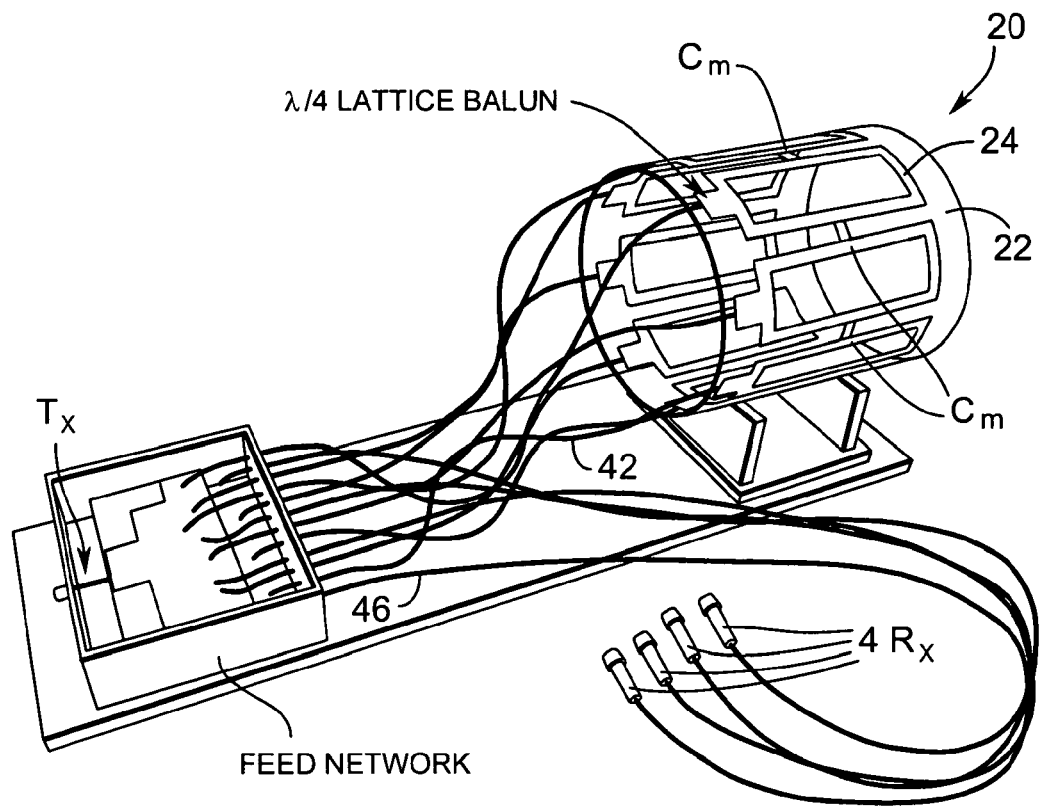
FIG. 1 is a perspective view of a transceive surface coil array for magnetic resonance imaging and spectroscopy and an associated feed network.
Figure 2:
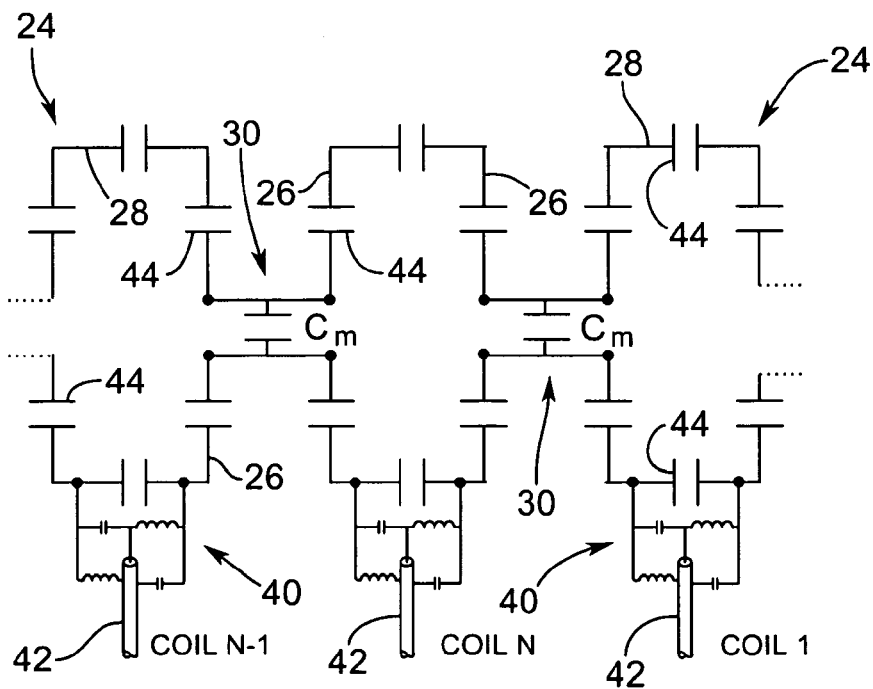
FIG. 2 is an equivalent circuit diagram for the transceive surface coil array in a transceive mode.

Turning now to FIGS. 1 and 2, a transceive surface coil (TSC) array for magnetic resonance imaging and spectroscopy is shown and is generally identified by reference numeral 20. As can be seen, TSC array 20 comprises a cylindrical supporting shell 22 on which are mounted a plurality of generally equally spaced, rectangular surface coils 24. The shell 22 is formed of acrylic and has inside and outside diameters of approximately 24.1 cm and 25.4 cm respectively. In this particular example, the TSC array includes eight (8) surface coils 24. Each of the surface coils 24 is substantially identical and is constructed of conductive strips, in this case copper tape, having a thickness equal to approximately 50 μm. Each surface coil 24 includes two legs 26 having a length of approximately 21 cm and two legs 28 having a length of approximately 8.1 cm. The width of each leg is approximately 63.5 mm and the inter-surface coil spacing is approximately 2 cm.

A magnetic decoupling circuit (MDC) 30 extends between each adjacent pair of surface coils 24. The magnetic decoupling circuits 30 are purely capacitive with each MDC including a single capacitor having a capacitance $C_m$. The capacitive reactance $(1/(\omega C_m))$ is equal to the mutual inductive reactance $(|\omega M|)$ between each surface coil at 170.3 MHz. The value of $C_m$ is function of the inter-surface coil spacing as will be described.

Each surface coil 24 is coupled to a feed network 38 via a quarter wavelength (λ/4) lattice balun 40 and a 50Ω coaxial cable 42. The inductor and capacitor arrangement of the λ/4 lattice baluns 40 is shown in FIG. 2. Low-loss lumped capacitors 44 are also distributed about the surface coils 24 to reduce dielectric losses (known as irrotational or coulomb electric field losses at high magnet fields) within the volume of interest of the TSC array 20.

The feed network 38 in the present example includes conventional 50Ω transmit and receive components including 50Ω preamplifiers and low cost, low power RF amplifiers. The feed network 38 splits a single transmit signal into eight (8) equally power divided signals (−9 dB) with a phase delay of 2π/8 between each signal and applies the signals to the surface coils 24 via the coaxial cables 42 and λ/4 lattice baluns 40 to approximate current distributions of a birdcage coil operating in a homogenous mode. The feed network 38 also recombines signals received by the surface coils 24 into four (4) channels via four (4) 90° branch line couplers and provides the received signals on coaxial cables 46.

The capacitors 30 act as magnetic decoupling circuits between nearest neighbor surface coils 24 that substantially eliminate the effects of nearest neighbor mutual inductance on resonance splitting and signal and noise correlation. The capacitance $C_m$ has a unique relationship with the magnitude of the mutual inductance (M) given by:

$$C_m = \frac{1}{\omega^2 |M|} \quad [1]$$

It should be noted that even though $k_m$ can be both positive and negative, the decoupling reactance remains capacitive and may remain in the same circuit layout. Strong and weak magnetic coupling between surface coils 24 can be substantially eliminated irrespective of the inter-surface coil spacing by adjusting the capacitance $C_m$ of the capacitors 30.

Although non-next nearest neighbor coupling may introduce peak splitting into the spectrum, loading due to both patient conductivity and impedance matching to the 50Ω coaxial cable has the effect of de-Qing the surface coils 24 thereby to provide spectral smoothing. This spectral smoothing effectively reunifies numerous peaks caused by non-next nearest neighbor interactions. For cylindrical TSC array geometries commonly used in head imaging and in this example, the non-next nearest neighbor coupling is sufficiently weak that the act of impedance matching to the 50Ω coaxial cables 42 unifies any resonance splitting.

The capacitive reactance $(X_C)$ required to eliminate resonance peak splitting at each separation is equal and opposite to the reactance of the mutual inductance $(X_M)$, $(L_{ind}=260$ nH) [cross correlation between $X_{Cm}$ & $X_M=-96.5\%$, p=1.6E-6, confidence interval a=0.95, N=11]. This magnetic decoupling reactance $(X_{Cm})$ effectively shorts the positive feedback coupling between resonance modes into degeneracy. As a result, the magnetic decoupling circuits 30 are able to decouple both strong and weak magnetic coupling. In the extreme case of $k_m=1$, the required decoupling capacitance (3.3 pF) is physically realizable. As the mutual inductance approaches zero, the capacitance required for decoupling approaches infinity. Fortunately, the magnetic decoupling circuits 30 become redundant when there is no mutual inductance between the surface coils 24.

Closed loop current paths in close proximity to surface coils 24 at high fields couple and degrade spectral responses, analogous to the effects of neighbouring surface coils within the TSC array 20. The benefits of using λ/4 lattice baluns 40 to reduce conservative electric field generated noise outweigh the detriments due to coupling. To avoid the additional closed loop current paths introduced by matching networks, the λ/4 lattice baluns 40 are used to both balance and match the surface coils 24 to the 50Ω coaxial cables 42. Furthermore, the parallel to series capacitance ratio may be used to reduce the effects of the varying patient to patient to loading on the overall matching. For the transceive mode, an open parallel circuit matched and tuned design has a spectral profile less influenced by other surface coils although it is more susceptible to impedance mismatch in patient-to-patient variance. Without proper balancing, the transmission line shield voltage potential rises above ground potential due to direct conductive coupling, and the shield acts as an antenna and increases the amount of conservative electric field coupling to the sample and noise correlation detected in the system.

Figure 3:
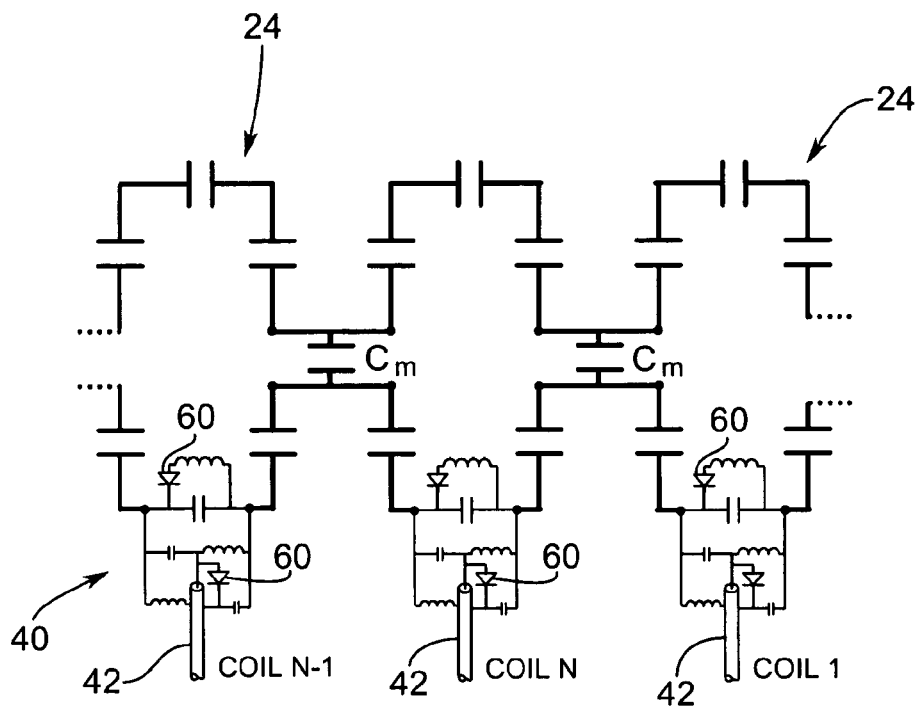
FIG. 3 is an equivalent circuit diagram for the transceive surface coil array in a receive-only mode.

The TSC array 20 can also be conditioned to a receive-only mode by altering the λ/4 lattice baluns 40. As shown in FIG. 3, in the receive-only mode, the λ/4 lattice baluns 40 include PIN diodes 60. The PIN diodes 60 electrically open each of the surface coils 24 during transmit operation of feed network 38.

To test the TSC array 20, a number of images were captured. All imaging data were obtained using 4 T Varian Unity INOVA whole-body MRI/MRS system (Palo Alto, Calif., USA) interfaced to Siemens Sonata Gradients and amplifiers (Erlangen, Germany).

In a first series of tests, the MR images were obtained using a spoiled steady state free precession imaging sequence, TR=22 ms, TE=15 ms, NRO=256 NPE=256, sweep width 60 kHz, FOV 20×20 cm, Δz=1 cm. The SNR from the both a hybrid birdcage and the TSC array 20 was calculated according to modified sum of squares method proposed by Constantinides et al. in the article entitled "Signal to noise measurements in magnitudes from NMR Phase Array" published in Magnetic Resonance Medicine Vol. 38, pages 852 to 857 (1997) to account for the noise amplification of magnitude images when combining data from multiple receivers. The four (4) receiver configuration of the TSC array 20 restricted use of all eight (8) channels independently. The feed network 38 equally transmitted power to all eight surface coils 45° out of phase and recombined coils in quadrature pairs to conform to the four (4) receiver configuration.

The gradient coupling between the non-shielded TSC array 20 and system gradients was not compensated for. A resonance frequency of 171.2 MHz was measured post acquisition and would suggest that better SNR is attainable.

Figure 5:
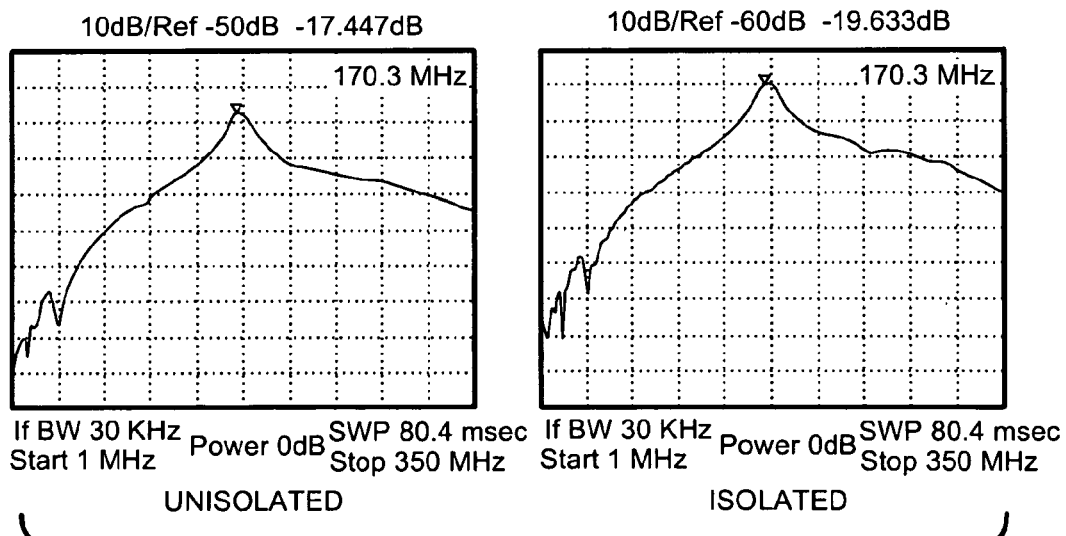
FIG. 5 shows the spectral profile for an isolated and unisolated surface coil.
Figure 4:
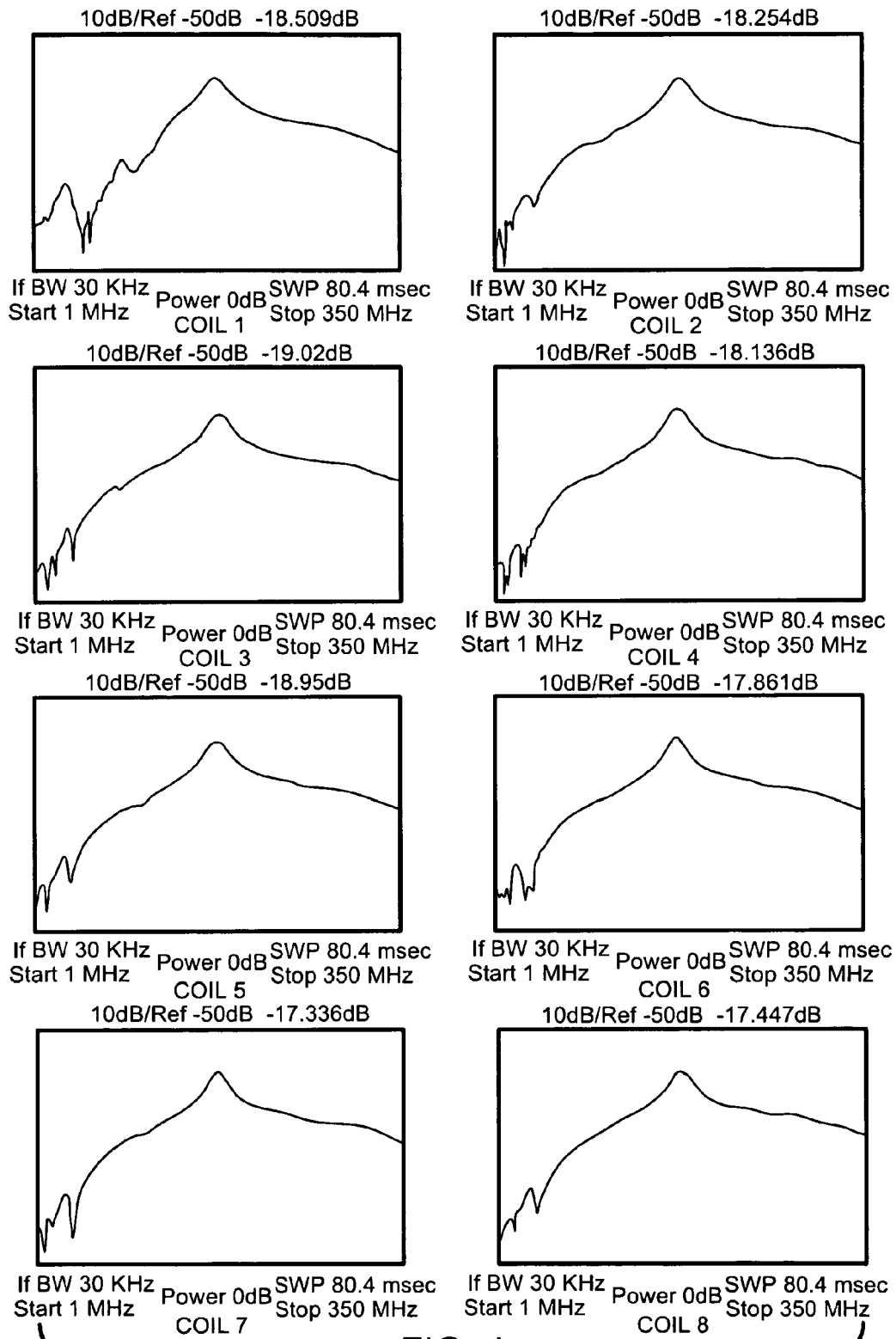
FIG. 4 shows the spectral profile for each surface coil of the transceive surface coil array.
Figure 6:
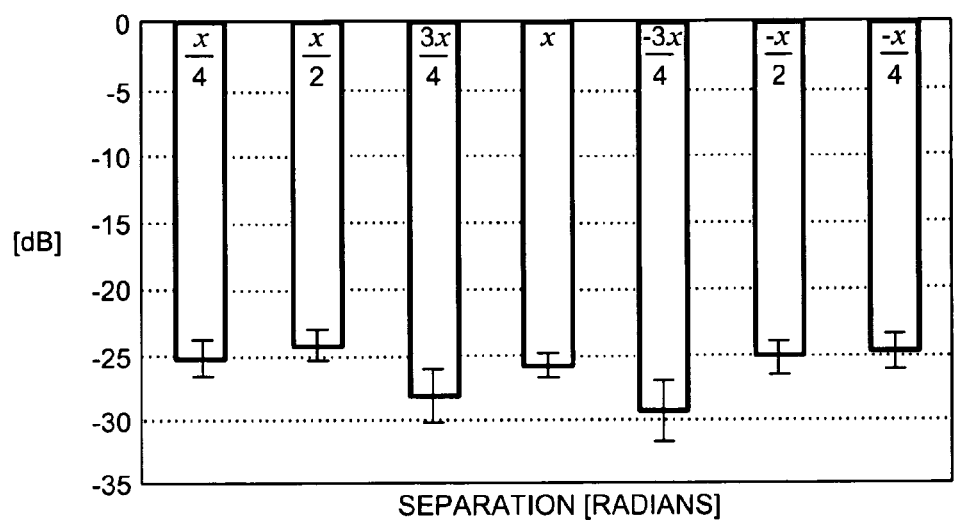
FIG. 6 is a graph showing isolation between surface coils as function of surface coil separation.

Two key parameters to assess the TSC array 20 are the spectrum profile, and the isolation between neighboring surface coils 24. Provided the non-next nearest neighbor interactions are weak, or there is sufficient loading, the array of surface coils 24 act as they would independently. A shielded field probe was centered on the inside of the transmit coil with all other coils loaded with 50Ω, and a loader shell to mimic the human head. As shown in FIG. 4, the spectral profile of each individual surface coil 24 is identical with the spectral response of that of an isolated surface coil as shown in FIG. 5, which validates the effectiveness of the magnetic decoupling scheme. The average isolation between surface coils 24 as a function of separation, measured with a Hewlett-Packard 4395A network/spectrum/impedance analyzer, is shown in FIG. 6 with respect to a through calibration. As expected, there is cylindrical symmetry of isolation with respect to surface coil separation. Since arbitrary orientation was chosen to measure separation, symmetry about 180° is expected. The maximum coupling between surface coil pairs is approximately −25 dB.

Figure 7:
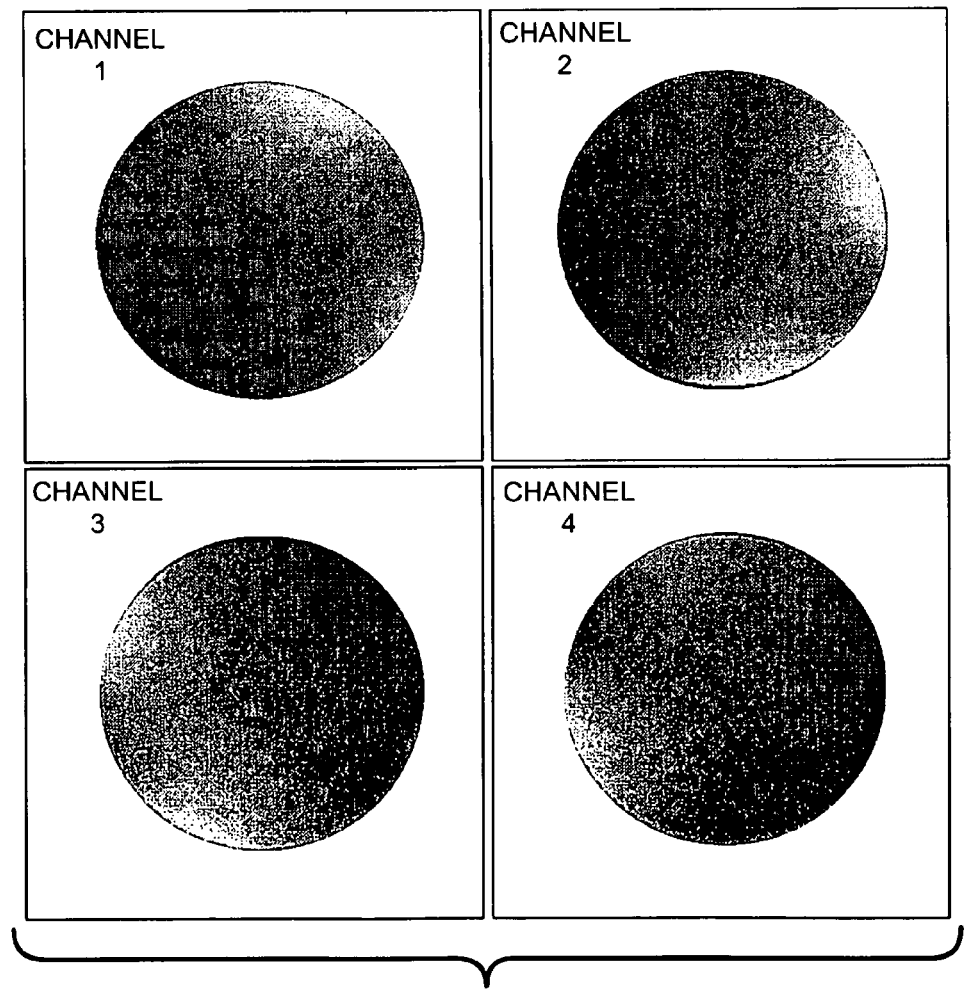
FIG. 7 shows field profiles of a cylindrical oil phantom generated using the transceive surface coil array.

A centered uniform cylindrical oil phantom having a diameter equal to 12.7 cm was used to test the recombination of orthogonal surface coils 24 through the feed network 38. An annulus loader shell (13 g NaCl, 1.9 g $CuSO_4$, 5.9235 L, inner diameter 16.5 cm, outer diameter 22.9 cm) was used to load the TSC array 20 to 50Ω. The field profiles of the four recombined receive channels are shown in FIG. 7. Each of the four receivers can be seen to be a superposition of orthogonal surface coils exemplifying the aforementioned high isolation between the receivers.

Figure 8:
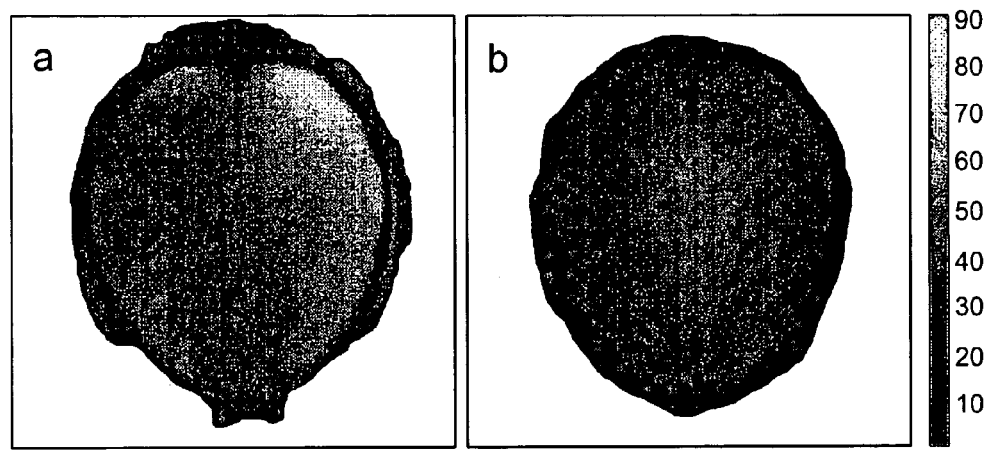
FIG. 8 are SNR maps within a human generated using the transceive surface coil array and using a hybrid birdcage.

SNR maps as shown in FIG. 8 were used to compare the TSC array 20 to a hybrid birdcage. The TSC array showed a 38% increase in average SNR measured throughout the entire head volume. A 9 fold increase in SNR was observed when the patient was in close proximity to the TSC array 20. In the center of the brain there is an 8% decrease in SNR (centered 11×11 voxel ROI).

In a second series of tests, the MR images were obtained using a spoiled steady state free precession (FLASH) sequence. The $|\beta^+|$ profile measurements were made by implementing the method proposed by Wang et al. in the article entitled "Measurement and correction of transmitter and receiver induced non-uniformaties in vivo" published in Magnetic Resonance Medicine, Vol. 53, pages 408 to 417 (2005) that uses the signal intensities of 2 spin echo sequences (TR/TE 5000/13 ms, FOVx=FOVy=25 cm, NRO=NPE=64) with exciting/refocusing flip angles of 60°/120° and 120°/240° respectively. The imaging parameters used for all head SNR images were: FOVx=FOVy=24 cm, TR=20 ms, TE=5 ms, a slice thickness of 1 cm, tip angle of 11°, NRO=NPE=256, with 2 averages per image. SNR maps were calculated for all surface coils 24 using the magnitude NMR phased array method of Constantinides et al. referenced above to account for additional magnitude noise accumulating from combination of multiple receiver channels. All isolation and spectral profiles (with the use of shielded RF field probes) measurements were made with a Hewlett-Packard 4395A network/spectrum/impedance analyzer.

The capacitive decoupling circuits 30 achieve approximately −25 dB of isolation (or better) between surface coils 24. In comparison, a typical isolation between a surface coil pair of similar geometry decoupled through natural decoupling (10% overlap) at 170.3 MHz is approximately −20 dB. This high degree of isolation between all surface coils 24 within the TSC array 20 allows each surface coil to act as it would in isolation. Hence, each surface coil 24 transmits and receives independently of each other. The RF spectral profiles as measured with field probes of each surface coil 24 within the TSC array 20 (loaded with an annular loader shell) do not differ from the spectral profile of a single surface coil in complete isolation, confirming the independence of each surface coil within the TSC array 20. Upon biasing in receive-only mode, the active decoupling of the TSC array provides greater than −20 dB of isolation relative to its unbiased field probe measurement. As a result, the transmit power for the oversized head (OH) coil required to achieve a 90° in both the transceive mode and the receive-only mode (using the TSC array modified for receive-only operation and the OH coil to transmit) are identical.

Figure 9:
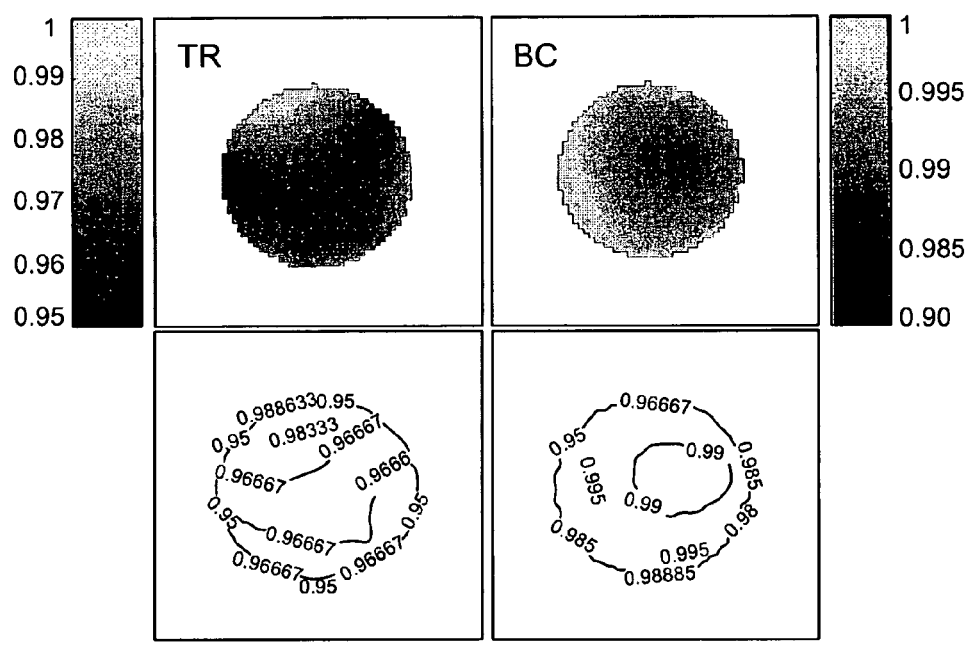
FIG. 9 shows transmit fields and contour plots for the transceive surface coil array in the transceive mode and for a hybrid birdcage.
Figure 10:
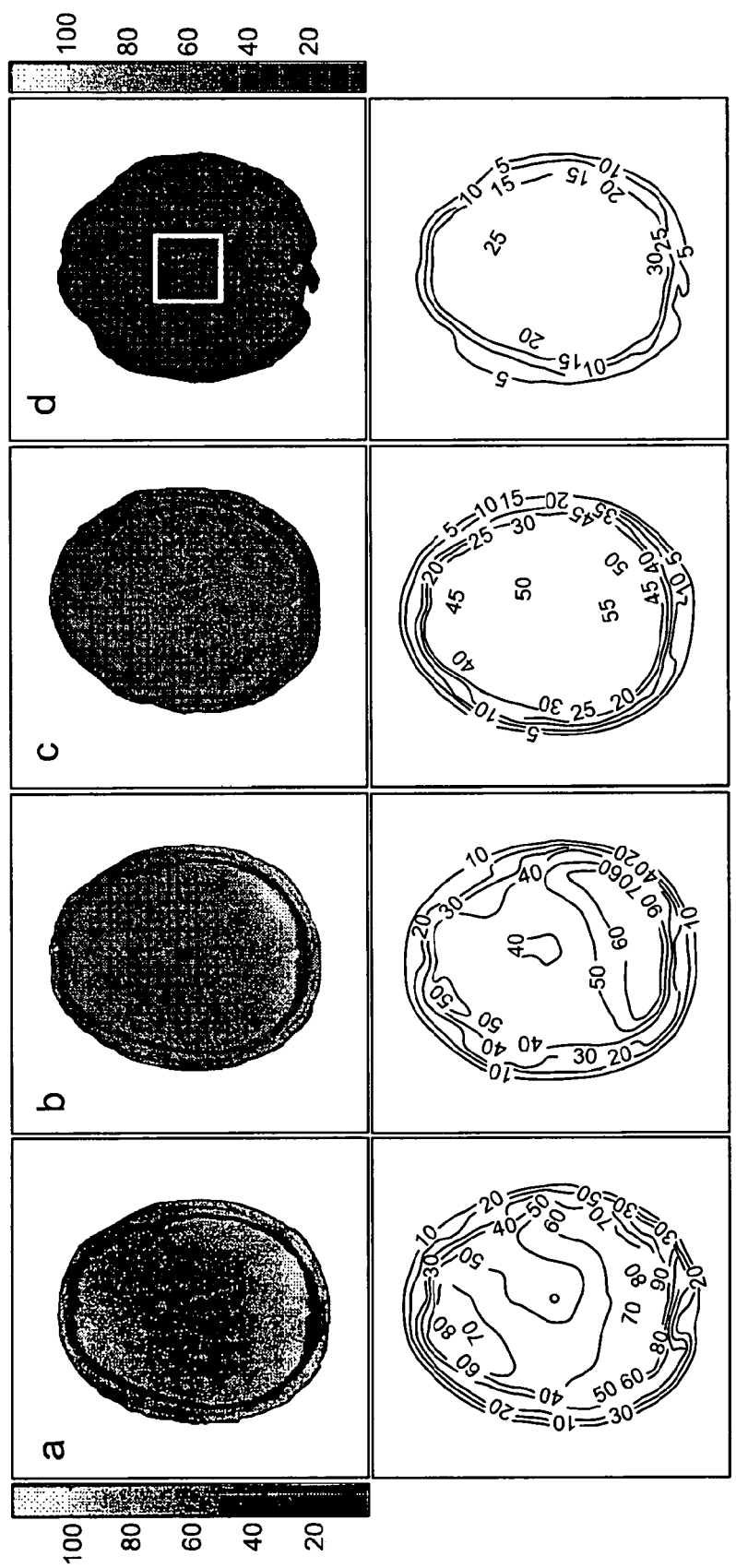
FIG. 10 shows SNR images and smoothed contour plots of a human head captured using the transceive surface coil array in the transceive mode, the transceive surface coil array in the receive-only mode, a hybrid birdcage and an oversized head coil.

A limitation of a surface coil for volume imaging is the penetration depth that it can achieve. To assess SNR performance, measurements were made within the human head of a volunteer. The transmit field $|\beta^+|$ profiles for the TSC array 20 in the transceive mode and a hybrid birdcage are shown in FIG. 9. The maximum (mean) transmit field inhomogeneity (relative to each surface coil's maximum field intensity) for the TSC array and hybrid birdcage are 4.2% (97.0) and 1.2% (99.3%) respectively. SNR images and smoothed contour plots of a human head captured using the TSC array 20 in the transceive mode (TR), the TSC array 20 in the receive-only mode (RO), a hybrid birdcage (BC) and an oversized head coil (OH) are shown in FIG. 10. These SNR images were reconstructed using the phased array reconstruction method proposed by Constantinides et al. referred to above. The mean SNR values within the brain volume and at the center of the brain (50×50 pixel region of interest (ROI) as outlined by the white box in part (d) of FIG. 10 are shown in Table 1 below:

TABLE 1

| Coil Type | TR | RO | BC | OH |
| --- | --- | --- | --- | --- |
| Mean SNR | 57.3 | 48.1 | 41.6 | 23.8 |
| Center SNR | 48.1 | 41.9 | 53.9 | 28.6 |

Compared to the standard hybrid birdcage a decrease of 10.7% (22.3%) in SNR is measured in the center brain region and an increase of 37.7% (15.6%) in SNR over the whole brain volume for the TSC array 20 in the transceive (receive-only) mode. A maximum 9-fold increase in SNR is measured in the brain region using the TSC array 20 as compared to the hybrid birdcage. There exists a 10.7% decrease of SNR in the center brain region of the TSC array 20 in the transcieve mode compared to the hybrid birdcage. Both hybrid birdcage values demonstrate a pronounced dielectric resonance in the centre of the array, with the centre SNR considerably enhanced relative to the mean.

The SNR of the TSC array 20 in the transceive mode is slightly higher than in the receive-only mode (see Table 1 and FIG. 10). Since the receive profiles are identical for both modes of operation (through the use of active decoupling), it would suggest that the TSC array 20 has better transmit capabilities. In practice, it is common to use a larger transmit RF coil than the receiver (when in receive-only mode) since two coils cannot occupy the same space within the magnet. The transmit capabilities of the TSC array 20 (when driven properly) are approximately equivalent to that of a comparable size hybrid birdcage. The SNR increase of the TSC array 20 in the transceive mode as compared to the TSC array operating in the receive-only mode could be attributed to better phase performance than the larger oversized head coil, resulting in effectively better quadrature than the larger coil. Although active decoupling provides a high degree of isolation, it is possible that the copper tape used to form the surface coils 24 shielded the sample from approximately 25% of the transmitted RF from the oversized head coil. The recent trend towards prolific use of multiple surface coils to increase fast parallel imaging efficiency would make this detrimental shielding effect more pronounced in the receive-only mode, making the transceive mode more desirable for higher SNR.

The 9-fold increase of SNR at the periphery of the brain with the TSC array 20 as compared to the hybrid birdcage can be attributed to the superior SNR sensitivity of the surface coils 24 in close proximity to the VOI (as seen in FIG. 10). This increase in peripheral SNR is comparable to results previously cited in the literature for surface coil arrays (SNR increase of six (6) in the human head for a receive-only surface coil array as proposed by Bodurka et al. in the article entitled "Scalable Multichannel MRI Data Acquisition System" published in Magnetic Resonance Medicine, Vol. 51, pages 165 to 171 (2004)). A notable decrease in SNR is shown in the deep brain compared to the twofold increase shown by Bodurka et al. Dielectric resonance of the human head at 4 T has a "bulls-eye" profile, which effectively decreases the sensitivity of the birdcage resonator in the peripheral regions of the brain and increases its sensitivity in the center of the brain. This apparent increase of signal for birdcage or TEM coils in the middle of the brain may explain the decrease (11%) in deep brain SNR measured for the TSC array 20, which inherently displays signal fall off deep into the VOI and which therefore may not have such striking dielectric effects. These results suggest that a conformal surface coil array may find application at very high fields, e.g. 7 T, where dielectric resonance effects dominate.

The variability of subject loading at each surface coil within the TSC array results in a correspondingly variable transmit power required for a 90° tip. A solution to this problem would be to use multiple low power RF amplifiers to transmit to each surface coil independently, or to implement the design on an elliptically conformal coil former to provide equal loading of all surface coils. This first solution would provides the ability to individually tailor the B1 field (both magnitude and phase) of each surface coil allowing for a means to achieve transmit SENSE and a means to accurately calibrate the transmit power delivered to each surface coil while being less costly than a single high power RF amplifier.

Through the use of capacitive decoupling circuits and surface coil placement, the TSC array 20 is able to transmit and receive through each surface coil independently while maintaining the use of conventional 50Ω amplifiers and preamplifiers. The high SNR of receive-only surface coils and fast parallel imaging capability can be achieved with a single multiple surface coil array, which can easily be incorporated into existing MR systems. In addition to proton applications, the TSC array could also find use in X-nucleus applications, where a homogeneous body coil for transmitting is not available.

Although the TSC array has been described as including eight (8) surface coils, those of skill in the art will appreciate that the TSC array may include more or fewer surface coils. Also, the surface coils need not be mounted on a cylindrical supporting shell. Other surface coil support configurations can be used depending on the particular target to be imaged. Further, the surface coils need not be rectangular. The shape and sizes of the surface coils can be tailored to the particular imaging environment in which the TSC array is being used. In addition, while magnetic decoupling circuits are shown interconnecting each adjacent pair of surface coils, those of skill in the art will appreciate that different magnetic decoupling circuit configurations can be used. For example, separate sets of surface coils can be magnetically decoupled independently of one another. In particular, in the case of a TSC array configured to image a patient's prostate, the TSC array includes two separate four (4) surface coil sets, each set of which is magnetically decoupled independently.

Although a single feed network is shown, those of skill in the art will appreciate that a separate circuit may be used to provide each surface coil with a transmit signal. This reduces the power required on a per surface coil basis enabling the use of multiple lower power RF transmitters and enabling transmit SENSE capabilities. In addition, the signal received by each surface coil can be applied to downstream circuitry independently of the feed network through TR switched or other technology enabling receive parallel imaging such as SENSE or SMASH.

Although preferred embodiments have been described, those of skill in the art will appreciate that variations and modifications may be made without departing from the spirit and scope thereof as defined by the appended claims.

What is claimed is:

1. A transceive surface coil array comprising:
    a plurality of spaced surface coils arranged about a volume, each surface coil transmitting input transmit signals and receiving incoming receive signals;
    a plurality of capacitive elements distributed about each surface coil, said capacitive elements reducing dielectric losses within said volume; and
    magnetic decoupling circuits acting between and magnetically decoupling adjacent pairs of surface coils, said magnetic decoupling circuits being primarily capacitive and being electrically connected in parallel with said surface coils.

2. A transceive surface coil array according to claim 1 wherein said magnetic decoupling circuits are purely capacitive.

3. A transceive surface coil array according to claim 2 wherein the capacitive reactance of each magnetic decoupling circuit is equal to the mutual inductive reactance between adjacent surface coils.

4. A transceive surface coil array according to claim 3 wherein said surface coils are arranged in sets, magnetic decoupling circuits acting between adjacent pairs of surface coils in each set.

5. A transceive surface coil array according to claim 3 further comprising baluns coupled to said surface coils.

6. A transceive surface coil array according to claim 5 wherein said baluns are impedance matched to feed network circuitry coupled thereto.

7. A transceive surface coil array according to claim 6 wherein said baluns are impedance matched to 50Ω component-based feed network circuitry.

8. A transceive surface coil array according to claim 6 wherein said feed network circuitry includes a separate low power transmitter for each surface coil.

9. A transceive surface coil array according to claim 6 wherein receive signals received by said surface coils bypass said feed network circuitry.

10. A transceive surface coil array according to claim 5 further comprising a feed network coupled to said baluns and communicating with said surface coils.

11. A transceive surface coil array according to claim 10 wherein said baluns are balanced and impedance matched to said feed network.

12. A transceive surface coil array according to claim 11 wherein said feed network comprises transmit and receive components.

13. A transceive surface coil array according to claim 12 wherein said transmit and receive components comprise 50Ω preamplifiers and radio frequency (RF) power amplifiers.

14. A transceive surface coil array according to claim 13 wherein said feed network further comprises a 50Ω coaxial cable connecting said baluns to said feed network.

15. A transceive surface coil array according to claim 10 wherein said baluns are configured to provide transmit signals generated by said feed network to said surface coils for transmit operation and to provide receive signals received by said surface coils to said feed network for receive operation.

16. A transceive surface coil array according to claim 15 wherein said feed network includes a separate low power transmitter for each surface coil.

17. A transceive surface coil array according to claim 15 wherein said feed network comprises transmit and receive components.

18. A transceive surface coil array according to claim 17 wherein said transmit and receive components comprise 50Ω preamplifiers and low cost RF power amplifiers.

19. A transceive surface coil array according to claim 10 wherein said baluns are configured to condition said surface coil array to a receive-only mode, in said receive-only mode, said baluns isolating said surface coils from said feed network when said feed network generates transmit signals.

20. A transceive surface coil array according to claim 19 wherein said feed network comprises transmit and receive components.

21. A transceive surface coil array according to claim 20 wherein said transmit and receive components comprise 50Ω preamplifiers and power amplifiers.

22. A transceive surface coil array according to claim 3 wherein each magnetic decoupling circuit comprises a single capacitor.

23. A transceive surface coil array according to claim 22 further comprising a dielectric support on which said surface coils are mounted.

24. A transceive surface coil array according to claim 23 wherein said distributed capacitive elements are low-loss lumped capacitors.

25. A transceive surface coil array according to claim 3 wherein said surface coils are generally equally spaced about said volume.

26. A transceive surface coil array comprising:
a surface coil support;
a plurality of generally evenly spaced surface coils mounted on said support and surrounding a volume into which a target to be imaged is placed, each surface coil transmitting input transmit signals and receiving incoming receive signals;
a plurality of capacitive elements distributed about each surface coil, said capacitive elements reducing dielectric losses within said volume; and
capacitive decoupling circuitry acting between and magnetically decoupling said surface coils to inhibit magnetic coil-to-coil coupling, said capacitive decoupling circuitry being electrically connected in parallel with said surface coils.

27. A transceive surface coil array according to claim 26 further comprising a feed network and impedance matching circuitry acting between said feed network and each of said surface coils.

28. A transceive surface coil array according to claim 27 wherein said feed network comprises transmit and receive components.

29. A transceive surface coil array according to claim 28 wherein said transmit and receive components comprise 50Ω preamplifiers and RF power amplifiers.

30. A transceive surface coil array according to claim 28 wherein said impedance matching circuitry is configured to provide transmit signals generated by said feed network to said surface coils for transmit operation and to provide receive signals received by said surface coils to said feed network for receive operation.

31. A transceive surface coil array according to claim 30 wherein said transmit and receive components comprise 50Ω preamplifiers and RF power amplifiers.

32. A transceive surface coil array according to claim 27 wherein said impedance matching circuitry comprising a λ/4 lattice balun associated with each surface coil.

33. An RF resonator comprising:
a surface coil array including an arrangement of non-overlapping magnetically decoupled surface coils encompassing a volume and a capacitive circuit between each pair of surface coils, each capacitive circuit comprising a single capacitor and being electrically connected in parallel with the associated pair of surface coils, each surface coil transmitting input transmit signals and receiving incoming receive signals;
a plurality of capacitive elements distributed about each surface coil, said capacitive elements reducing dielectric losses within said volume; and
a feed network coupled to said surface coil array, said feed network receiving signals received by said surface coils during imaging of a target within said volume.

34. An RF resonator according to claim 33 wherein said feed network comprises 50Ω transmit and receive components.

35. An RF resonator according to claim 34 wherein said surface coil array comprising impedance matching circuitry acting between each surface coil and said feed network.

36. An RF resonator according to claim 35 wherein said feed network provides transmit signals to said surface coils via said impedance matching circuitry.

37. A transceive surface coil array comprising:
a surface coil support;
an arrangement of non-overlapping magnetically decoupled surface coils mounted on said support and encompassing a volume into which a target to be imaged is placed, each surface coil transmitting input transmit signals and receiving incoming receive signals;

a capacitive circuit between adjacent surface coils, each capacitive circuit comprising a single capacitor and being electrically connected in parallel with the associated adjacent surface coils; and a plurality of capacitive elements distributed about each surface coil, said capacitive elements reducing dielectric losses within said volume.

38. A transceive surface coil array according to claim 37 wherein each of said surface coils is generally identical.

39. A transceive surface coil array according to claim 38 wherein said surface coils are at least one of varying shape and size.

40. A transceive surface coil array according to claim 39 wherein said surface coils are grouped into sets, the surface coils in each set being magnetically decoupled independent of other sets.

41. A transceive surface coil array according to claim 40 wherein said surface coils receive transmit signals from at least one radio frequency transmitter.

42. A transceive surface coil array according to claim 41 wherein said surface coils receive transmit signals from a single transmitter.

43. A transceive surface coil array according to claim 42 wherein each surface coil receives transmit signals from an associated transmitter.

* * * * *